(12) United States Patent
Lin et al.

(10) Patent No.: US 8,049,226 B2
(45) Date of Patent: Nov. 1, 2011

(54) LIGHT-EMITTING DEVICE

(75) Inventors: Jin-Ywan Lin, Hsinchu (TW);
Tzer-Perng Chen, Hsinchu (TW);
Pai-Hsiang Wang, Hsinchu (TW);
Chih-Chiang Lu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 30 days.

(21) Appl. No.: 12/216,277

(22) Filed: Jul. 2, 2008

(65) Prior Publication Data

US 2009/0020776 A1    Jan. 22, 2009

(30) Foreign Application Priority Data

Jul. 19, 2007   (TW) ............................... 96126501 A

(51) Int. Cl.
*H01L 33/00* (2010.01)
(52) U.S. Cl. ...................... 257/79; 257/98; 257/E33.001
(58) Field of Classification Search ...................... 257/79
See application file for complete search history.

(56) References Cited

U.S. PATENT DOCUMENTS

| 6,813,298 B2 * | 11/2004 | Chan et al. ................. 372/45.01 |
| 2001/0038101 A1 * | 11/2001 | Nemoto ............................ 257/89 |
| 2006/0105492 A1 * | 5/2006 | Veres et al. ...................... 438/99 |
| 2006/0128118 A1 * | 6/2006 | Nagahama et al. ............ 438/458 |
| 2007/0090377 A1 * | 4/2007 | Lin et al. .......................... 257/94 |

* cited by examiner

*Primary Examiner* — Michael Trinh
*Assistant Examiner* — Lawrence Tynes, Jr.
(74) *Attorney, Agent, or Firm* — Bacon & Thomas, PLLC

(57) ABSTRACT

A light-emitting device comprises a channel structure in the semiconductor layer for connecting an electrode and an ohmic contact layer by means of a substrate transfer process including a wafer-bonding process and a substrate-lifting-off process. The channel structure is formed in the semiconductor stack for electrically connecting the ohmic contact layer and the electrode and driving the current into the light-emitting device. Thereby, a horizontal type or a vertical type of light-emitting device has a good ohmic contact and high light efficiency.

20 Claims, 8 Drawing Sheets

LIGHT-EMITTING DEVICE

BACKGROUND

1. Technical Field

The invention relates to a light-emitting device, and more particularly to a light-emitting device having a channel structure penetrated a semiconductor stack.

2. Reference to Related Application

This application claims the right of priority based on TW application Ser. No. 096126501, filed Jul. 19, 2007, entitled "LIGHT-EMITTING DEVICE", and the contents of which are incorporated herein by reference.

3. Description of the Related Art

Light-emitting diodes (LEDs) are wildly used as light sources. Comparing with conventional incandescent lamps and fluorescent lamps, LEDs have advantages in power saving, longer life time and cost concern. LEDs replace conventional light sources and have been wildly used in various fields such as traffic lights, backlight modules, street lights and medical devices.

The demand of brightness for LEDs becomes higher as the application and development evolves. It is an important topic for the industry to improve the light efficiency and raise the brightness. One of the conventional methods is using substrate transfer process to replace the original growth substrate by a substrate that is transparent or thermally conductive. The light efficiency and brightness are therefore highly improved.

Referring to FIG. 9, a generally known InGaN light-emitting diode device manufactured by the conventional substrate transfer process is presented. The structure from bottom to top is followed by: a p-type electrode 41, a permanent substrate 42, a connecting layer 43, a semiconductor stack 44 (including a p-type semiconductor layer 443, a light-emitting layer 442 and an n-type semiconductor layer 441), an n-type ohmic contact layer 45 and an n-type electrode 46. The structure described above is a vertical structure formed by metal adhesion process. In order to have ohmic contact with the n-type electrode 46 and the n-type semiconductor layer 441, an un-doped layer (not shown in FIG. 1) under the n-type semiconductor layer 441 is removed, an n-type ohmic contact layer 45b is formed under the n-type semiconductor layer 441, and an n-type electrode 46 is formed on the ohmic contact layer 45. However, the removal of the un-doped layer from the structure usually causes a high driving voltage.

SUMMARY

A light-emitting device is disclosed. The light-emitting device includes a semiconductor stack, an ohmic contact layer and a least an electrode. The reactive ion-beam etching process is applied to form a channel penetrated the semiconductor stack. The channel is filled with metal to form a channel structure for electrically connecting to the ohmic contact layer and the electrode separately located at two opposite sides of the semiconductor stack. The current can flow from the electrode, the channel structure, the ohmic contact layer to the semiconductor stack and drive the light-emitting device. By the design of the channel structure, a light-emitting device having a good ohmic contact and better light efficiency is disclosed.

One embodiment of this invention discloses a replacement of the growth substrate of a light-emitting device by a conductive substrate by a substrate transfer process. The n-type semiconductor layer in the semiconductor stack is etched to form an n-type channel by reactive ion-bean etching process. The n-type channel is filled with metal to form an n-type channel structure and an n-type electrode for electrically connecting to the n-type ohmic contact layer and the n-type electrode separately located at two opposite sides of the semiconductor stack to form a vertical light-emitting device.

Another embodiment discloses a substrate transfer process to replace the growth substrate of a light-emitting device by a thermally conductive substrate. The n-type semiconductor layer and p-type semiconductor layer in the semiconductor stack is etched by reactive ion-bean etching process to form an n-type channel and p-type channel. Between the n-type channel and the p-type channel, a blocking channel penetrates the n-type semiconductor layer and the semiconductor stack by etching process for insulation. By the design of the n-type channel, the p-type channel and the blocking channel, a horizontal light-emitting device having a good ohmic contact is disclosed.

Another embodiment of this invention is to roughen the light extraction surface near the n-type semiconductor on the vertical or horizontal light-emitting device to form a scraggy surface. The light efficiency of the light-emitting device is increased by the roughened surface describe above.

BRIEF DESCRIPTION OF THE DRAWINGS

The accompanying drawings are included to provide easy understanding of the invention, and are incorporated herein and constitute a part of this specification. The drawings illustrate embodiments of the invention and, together with the description, serve to illustrate the principles of the invention.

DESCRIPTION OF THE PREFERRED EMBODIMENTS

Figure 1:
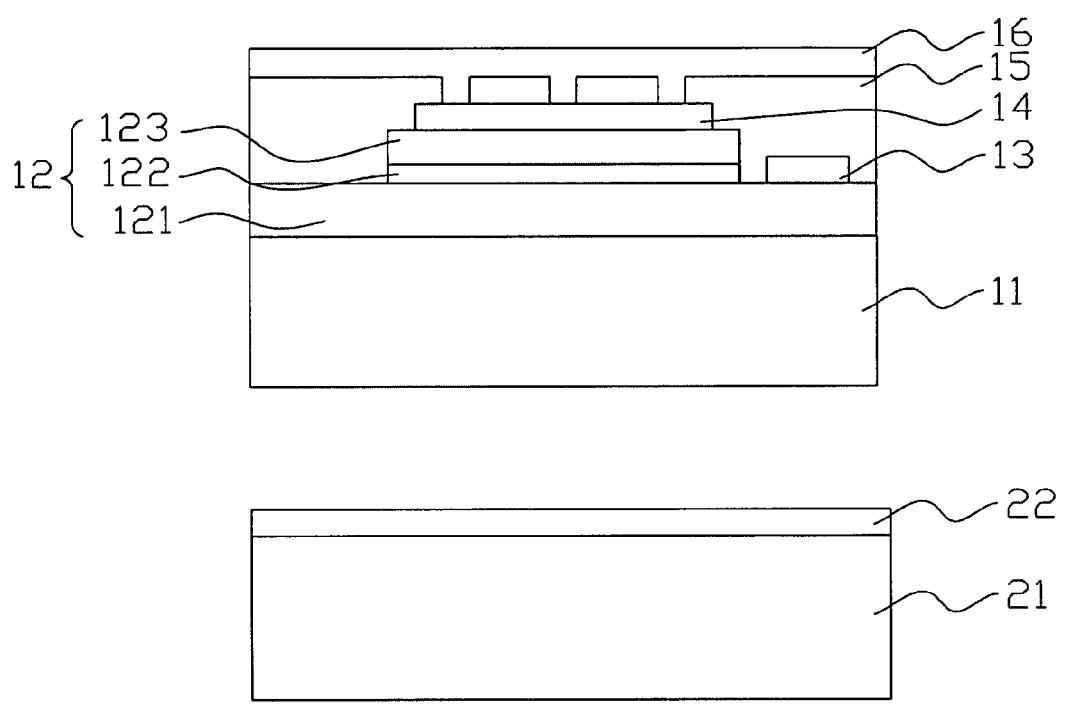
FIG. 1 shows the first manufacturing process with a first embodiment of the present invention.

Reference is made in detail to the preferred embodiments of the present invention, examples of which are illustrated in the accompanying drawings. Wherever possible, the same reference numbers are used in the drawings and the description to refer to the same or like parts.

Figure 4:
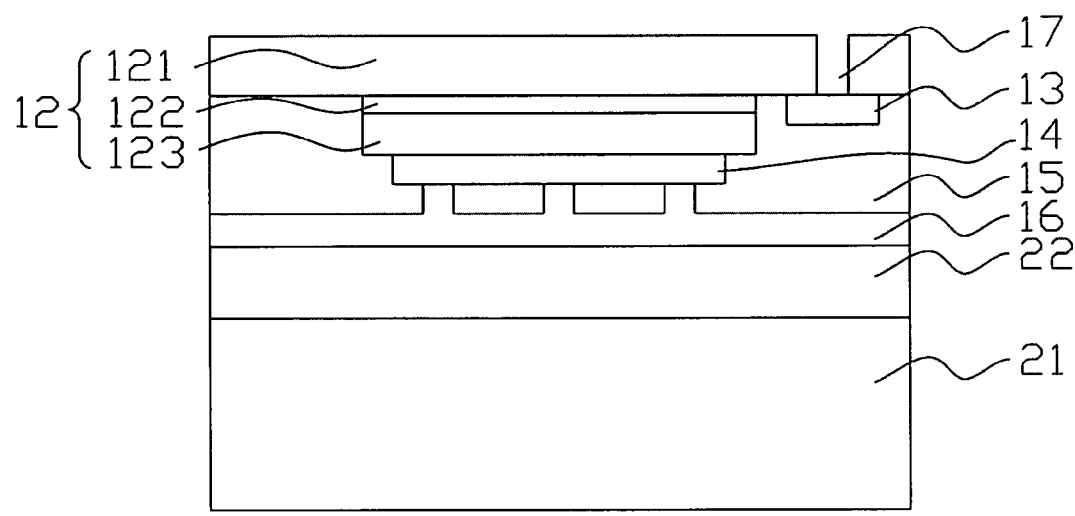
FIG. 4 shows the fourth manufacturing process with a first embodiment of the present invention.
Figure 5:
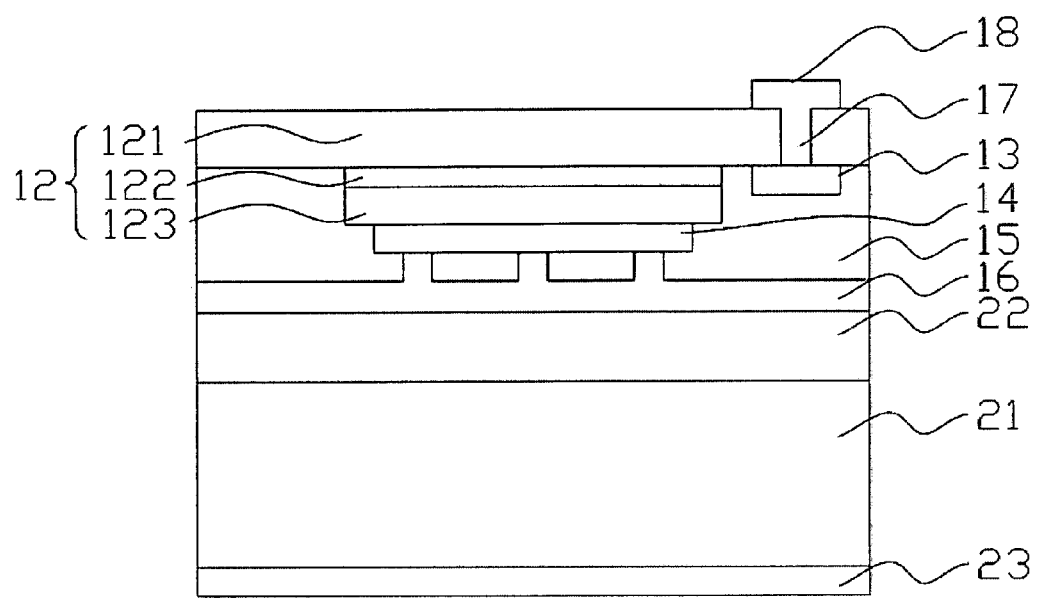
FIG. 5 shows the fifth manufacturing process with a first embodiment of the present invention.

Referring to FIG. 5, a schematic view of a vertical light-emitting device 100 in accordance with a first embodiment of the present invention is disclosed. The vertical light-emitting device 100 is manufactured by substrate transfer process, including wafer-bonding process, substrate-lifting-off process and reactive ion-beam etching process. The related processes are shown as FIG. 1 to FIG. 5 with detailed illustrating as follows:

Referring to FIG. 1, a light-emitting structure in accordance with the first embodiment of this invention including a growth substrate 11, a semiconductor stack 12, an n-type ohmic contact layer 13, a transparent conductive layer 14, a dielectric layer 15 and a metal reflective layer 16 is disclosed. The semiconductor stack 12 described above also includes an n-type semiconductor layer 121, a light-emitting layer 122 and a p-type semiconductor layer 123. Furthermore, a connecting layer 22 is formed on a permanent substrate 21. A buffer layer can be formed on the growth substrate 11 to reduce the dislocation or crystalline defects during the epitaxial growth of the nitride semiconductor stack 12 such as GaN, AlGaN, or InAlGaN as the stack is formed on the buffer layer. The growth substrate 11 can be a sapphire substrate, and the buffer layer can be AlN, GaN, or AlGaN. The transparent electrode 14 is made by Indium Tin Oxides (ITO); it can disperse current efficiently and increase the light extraction efficiency because of its transparency. The dielectric layer 15 can be formed by inorganic dielectric material such as $SiO_2$, $Al_2O_3$, SiNx, or spin-on glass; it also can be formed by organic dielectric material such as epoxy, polyimide, or benzocyclobutene. An n-type ohmic contact layer 13 is formed with the material which is able to form ohmic contact with the n-type semiconductor 121, such as Indium Tin Oxides (ITO) and metal such as Al or Ni. A metal reflection layer 16 is formed with the conductive material having high reflective index, such as Al or Ag. A permanent substrate 21 is conductive and is formed with materials such as silicon, copper, etc.

Figure 2:
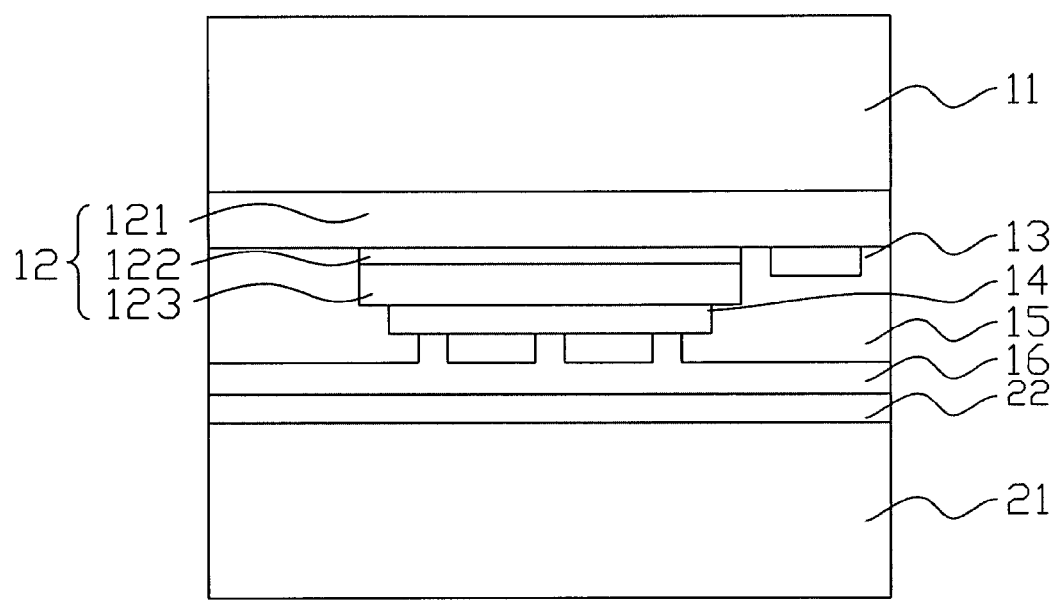
FIG. 2 shows the second manufacturing process with a first embodiment of the present invention.

Referring to FIG. 2, a second process of the first embodiment of this invention is disclosed. The two substrates are connected as a whole by a connecting process such as direct adhesion or metal adhesion through a connecting layer 22. The direct adhesion applies a fixed force in a high temperature (>400° C.) to melt the materials along the interface and make the materials connected. The metal adhesion forms metal layers separately on two surfaces, then applies a fixed force in a lower temperature (200° C.~300° C.) to form an interface by joining the two surfaces with the metal layers.

Figure 3:
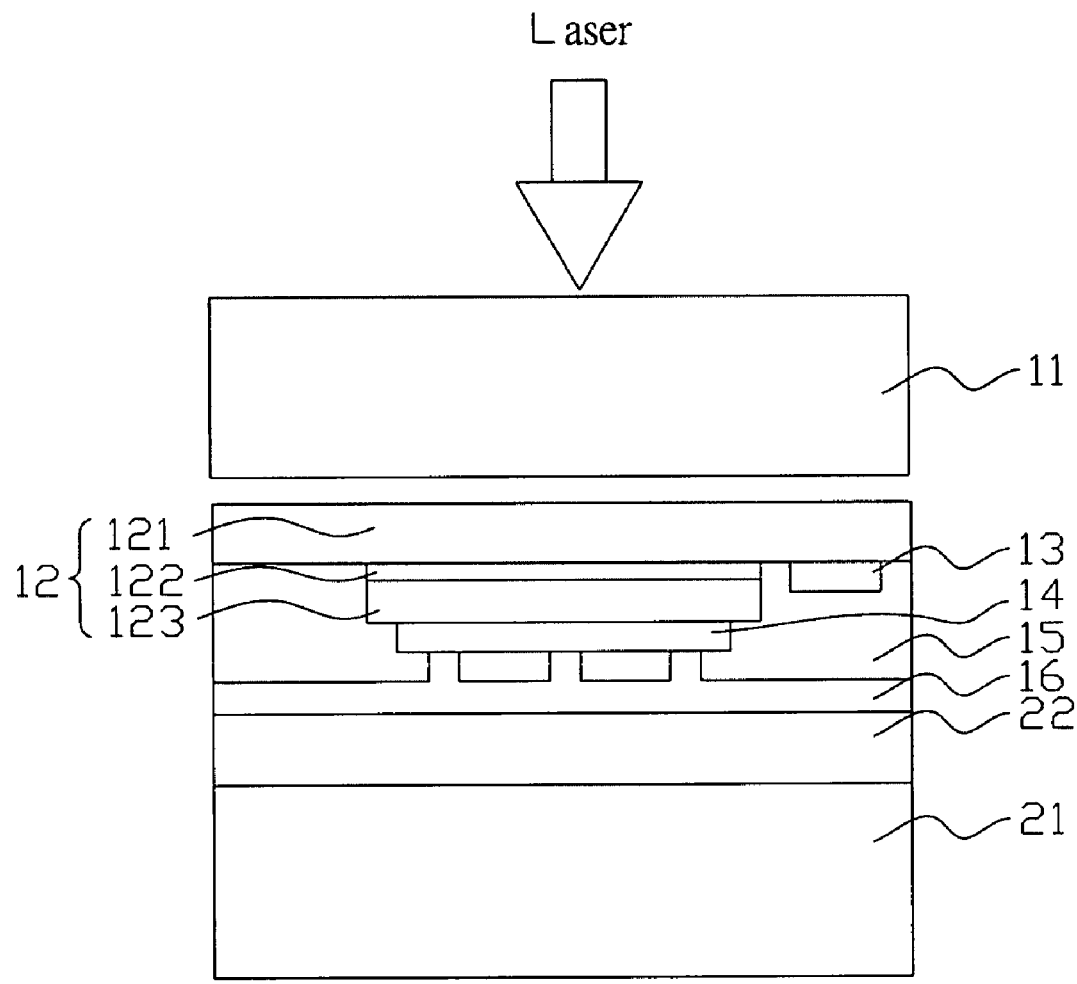
FIG. 3 shows the third manufacturing process with a first embodiment of the present invention.

Referring to FIG. 3, a third process of the first embodiment of this invention is disclosed. The growth substrate 11 is removed by the substrate removal process such as laser lift off process. The excimer laser projects at the interface of the growth substrate 11 and the semiconductor stack 12, and most of the laser energy is absorbed there to decompose the buffer layer such as AlN, so the growth substrate can be separated.

Referring to FIG. 4, a fourth process of the first embodiment this invention is disclosed. The n-type semiconductor layer 121 is etched by reactive ion-beam etching (RIE) process to form an n-type channel 17 and expose the n-type ohmic contact layer 13. The RIE process has many advantages, for example, the high resolution of linewidth, good selectivity, high etching rate, independent process parameters, and less residue. Therefore, it is a trend to replace the wet etching process by RIE process in the semiconductor processes. The induced coupled plasma reactive ion etching (ICP-RIE) process is chosen for dry etching in this embodiment By the method of etching parameter analysis, the flow of reactive gas ($BCl_3$/Ar), pressure, inductively coupled plasma power and RF power (bias voltage of DC-bias) is adjusted to determine the relationships of the etching speed, etching selectivity, etching direction, surface roughness and role of the mask so the best etching process for forming the n-type channel 17 is established.

Referring to FIG. 5, a fifth process of the first embodiment of this invention is disclosed. The n-type channel 17 is filled by metal to form an n-type channel structure and n-type electrode 18 for electrically connecting with the n-type ohmic contact layer 13. A metal layer is formed above the permanent substrate 21 as a p-type electrode 23.

A vertical light-emitting device 100 formed by the processes described above is a vertical light-emitting device with an n-type electrode on the top. In this embodiment, the n-type channel 17 makes the n-type electrode 18 have good ohmic contact with the n-type ohmic contact layer 13. Normally, the problem of high driving voltage caused by the worse ohmic contact between the n-type electrode and the n-type semiconductor layer can be solved.

Another embodiment of this invention is to further form a rough surface after forming a vertical light-emitting device 100 by the processes described above. The light extraction surface close to the n-type semiconductor layer 121 is roughened to have a scraggy surface to increase the light efficiency of the light-emitting device.

Figure 6:
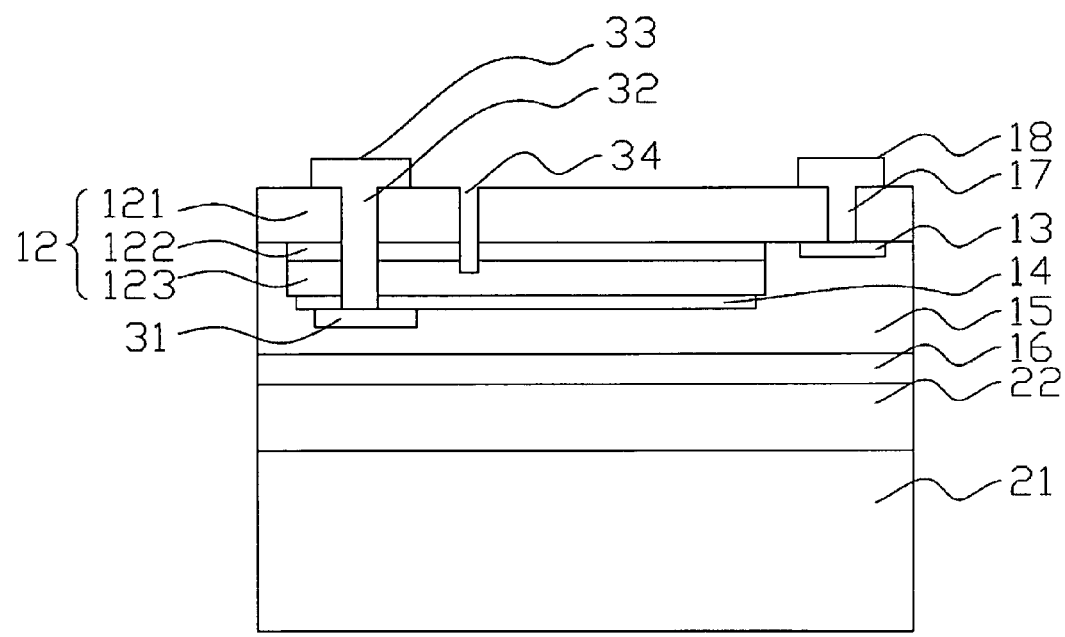
FIG. 6 is a light-emitting device in accordance with a second embodiment of the present invention.

FIG. 6 shows the second embodiment of this invention with a horizontal light-emitting device 200. The major processes of this embodiment, for example, connecting process, substrate-lifting-off process and reactive ion-beam etching process, are the same as the first embodiment. The horizontal light-emitting device 200 shown in FIG. 6 is described as follows:

The structure of the horizontal light-emitting device 200 as described in the second embodiment comprising a permanent substrate 21, a connecting layer 22, a metal reflective layer 16, a dielectric layer 15, a transparent conductive layer 14, a semiconductor stack 12 (including an n-type semiconductor layer 121, a light-emitting layer 122 and a p-type semiconductor layer 123), an n-type ohmic contact layer 13 and a p-type ohmic contact layer 31. Next, an n-type channel 17 is formed by the reactive ion-beam etching process to penetrate an n-type semiconductor layer 121. The n-type channel is filled by metal to form an n-type channel structure and n-type electrode 18 for electrically connecting with the n-type ohmic contact layer 13. A p-type channel 32 is formed by etching to penetrate the semiconductor stack 12. The p-type channel is filled by metal to form a p-type channel structure and p-type electrode 33 for electrically connecting with the p-type ohmic contact layer 31. Finally, a blocking channel 34 is etched to penetrate the n-type semiconductor layer 121 and the light-emitting layer 122 between the n-type channel 17 and the p-type channel 32 for insulation. With the n-type channel 17, the p-type channel 32 and the blocking channel 34, a horizontal light-emitting device having a good ohmic contact is disclosed. In the embodiment, the permanent substrate is thermally conductive, and the life time of the light-emitting device is increased accordingly.

Another embodiment of this invention is to further form a rough surface after forming a vertical light-emitting device 200 by the processes described above. The light extraction surface close to the n-type semiconductor layer 121 is roughened to have a scraggy surface to increase the light efficiency of the light-emitting device.

Figure 7:
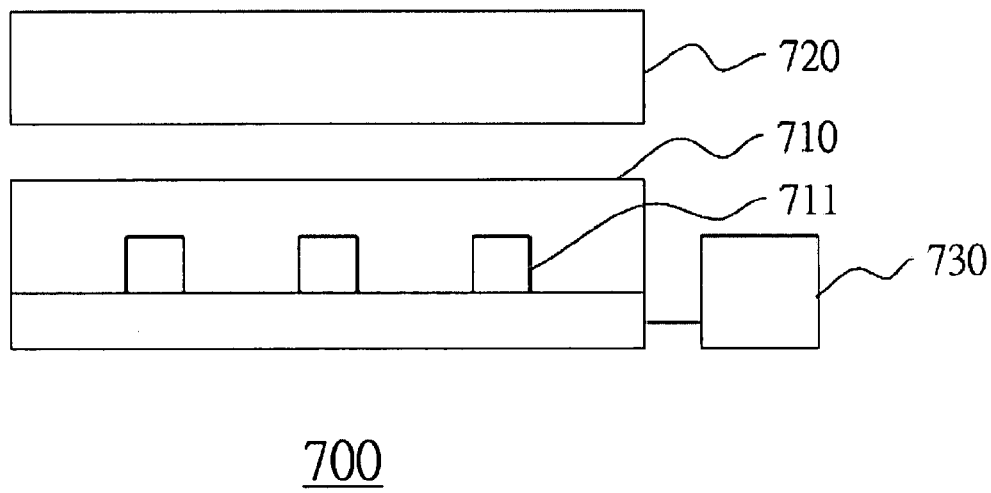
FIG. 7 is a schematic illustration of the backlight module of the present invention.

FIG. 7 shows a backlight module structure according to this invention, wherein the backlight module structure 700 including: a light source device 710 having a light-emitting device 711 made according to any embodiment of this invention described above, an optics device 720 deposited on the light extraction pathway of the light source device 710 to make a proper arrangement before the light extraction. A power supplement system 730 to supply power to the light source device 710 described above.

Figure 8:
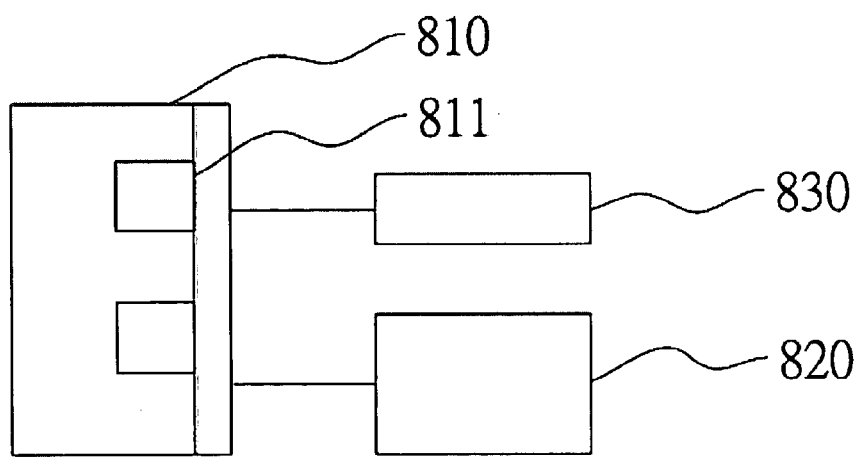
FIG. 8 is a schematic illustration of the lighting device of the present invention.
Figure 9:
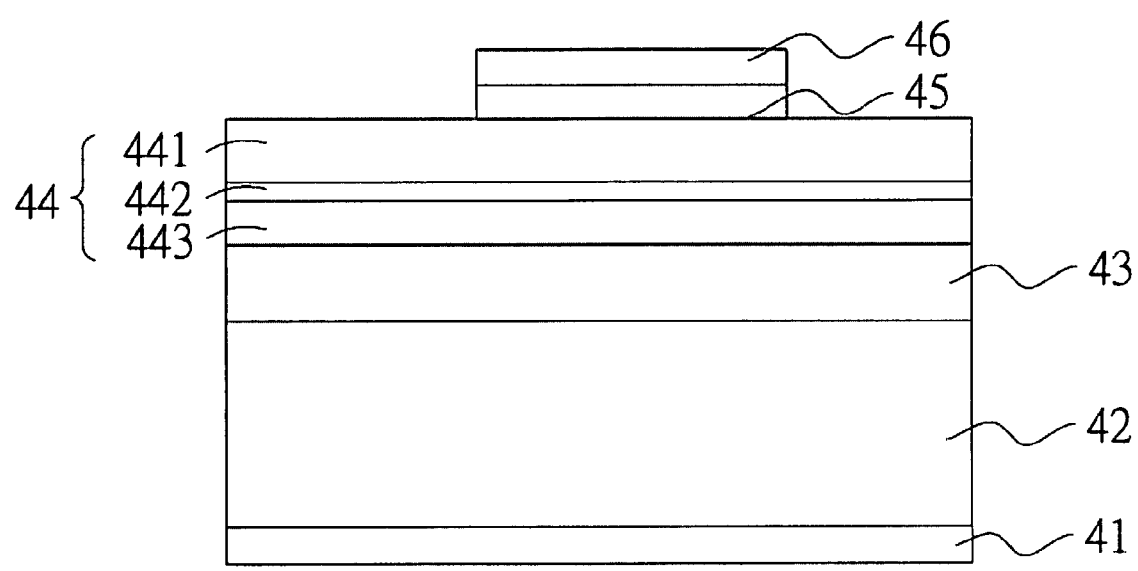
FIG. 9 is a schematic illustration of conventional light-emitting device.

FIG. 8 shows a lighting device according to this invention, wherein the lighting device 800 is a car lamp, a street light, a flashlight, an indicator light, etc. The lighting device 800 including: a light source device 810 having a light-emitting device 811 made according to any embodiment of this invention described above, a power supplement system 820 to supply power to the light source device 810 described above, and a control element to control the current driven into the light source device 810.

What is claimed is:

1. A light-emitting device comprising:
a nitride semiconductor stack having an n-type semiconductor layer, a light-emitting layer and a p-type semiconductor layer, wherein part of the light-emitting layer and the p-type semiconductor layer is removed to expose part of the n-type semiconductor layer;
a first conductive layer located directly on and below a lower side of the n-type semiconductor layer;
a second conductive layer located directly on an upper side of the exposed part of the n-type semiconductor layer wherein the upper side is opposite to the lower side;
wherein the n-type semiconductor layer comprises a first channel structure penetrating the n-type semiconductor layer for electrically connecting the first conductive layer to the second conductive layer.

2. The light-emitting device according to claim 1, wherein the first conductive layer is an ohmic contact layer and the second conductive layer is an electrode.

3. The light-emitting device according to claim 1, further comprising a connecting layer and a permanent substrate, wherein the second conductive layer and the connecting layer are separately located at two opposite sides of the nitride semiconductor stack to connect the nitride semiconductor stack and the permanent substrate.

4. The light-emitting device according to claim 3, further comprising a second electrode formed below the permanent substrate.

5. The light-emitting device according to claim 3, further comprising a metal reflective layer formed between the nitride semiconductor stack and the connecting layer.

6. The light-emitting device according to claim 5, further comprising a transparent conductive layer formed between the p-type semiconductor layer and the metal reflective layer.

7. The light-emitting device according to claim 5, further comprising a dielectric layer formed between the metal reflective layer and the n-type semiconductor layer.

8. The light-emitting device according to claim 1, wherein the n-type semiconductor layer having a roughened surface.

9. A light-emitting device comprising:
a nitride semiconductor stack having an n-type semiconductor layer, a light-emitting layer and a p-type semiconductor layer, wherein part of the light-emitting layer and the p-type semiconductor layer is removed to expose part of the n-type semiconductor layer;
a first conductive layer located directly on and below a lower side of the n-type semiconductor layer;
a second conductive layer located directly on an upper side of the exposed part of the n-type semiconductor layer wherein the upper side is opposite to the lower side;
a third conductive layer located on a lower side of the nitride semiconductor stack;
a fourth conductive layer located on an upper side of the nitride semiconductor stack wherein the upper side is opposite to the lower side;
wherein the n-type semiconductor layer comprises a first channel structure penetrating the n-type semiconductor layer for electrically connecting to the first conductive layer and the second conductive layer; the nitride semiconductor stack comprises a second channel structure penetrating the nitride semiconductor stack for electrically connecting to the third conductive layer and the fourth conductive layer.

10. The light-emitting device according to claim 9, wherein the first conductive layer is a first ohmic contact layer, the second conductive layer is a first electrode, the third conductive layer is a second ohmic contact layer and the fourth conductive layer is a second electrode.

11. The light-emitting device according to claim 9, further comprising a blocking channel located between the first channel and the second channel and penetrating the n-type semiconductor layer and the light-emitting layer.

12. The light-emitting device according to claim 9, further comprising a connecting layer and a permanent substrate, wherein the second conductive layer and the connecting layer are separately located at two opposite sides of the nitride semiconductor stack to connect the nitride semiconductor stack and the permanent substrate.

13. The light-emitting device according to claim 11, further comprising a metal reflective layer formed between the nitride semiconductor stack and the connecting layer.

14. The light-emitting device according to claim 9, further comprising a transparent conductive layer formed between the third conductive layer and the p-type semiconductor layer.

15. The light-emitting device according to claim 12, wherein the permanent substrate is thermally conductive substrate.

16. The light-emitting device according to claim 9, wherein the n-type semiconductor layer having a roughened surface.

17. A light-emitting device comprising:
a nitride semiconductor stack having a first semiconductor layer, a light-emitting layer and a second semiconductor layer;
a first conductive layer located directly on and below a lower side of the first semiconductor layer;
a second conductive layer located directly on an upper side of the second semiconductor layer wherein the upper side is opposite to the lower side;
wherein the first semiconductor layer comprises a first channel structure penetrating the first semiconductor layer for electrically connecting to the first conductive layer and the second conductive layer.

18. The light-emitting device according to claim 17, wherein the first semiconductor layer comprises a roughened surface.

19. The light-emitting device according to claim 17, further comprising a second channel structure penetrating the semiconductor stack for electrically connecting to a third conductive layer and a fourth conductive electrode.

20. The light-emitting device according to claim 19, further comprising a blocking channel located between the first channel structure and the second channel structure and penetrating the first semiconductor layer and the light-emitting layer.

* * * * *